(12) United States Patent
Mustiere et al.

(10) Patent No.: US 8,711,015 B2
(45) Date of Patent: Apr. 29, 2014

(54) SPARSE DATA COMPRESSION

(75) Inventors: Frederic Mustiere, Ottawa (CA); Hossein Najaf-Zadeh, Stittsville (CA); Ramin Pishehvar, Ottawa (CA); Hassan Lahdili, Gatineau (CA); Louis Thibault, Gatineau (CA); Martin Bouchard, Cantley (CA)

(73) Assignee: Her Majesty the Queen in Right of Canada as represented by the Minister of Industry, through the Communications Research Centre Canada, Ottawa, Ontario (CA)

( * ) Notice: Subject to any disclaimer, the term of this patent is extended or adjusted under 35 U.S.C. 154(b) by 483 days.

(21) Appl. No.: 13/216,295

(22) Filed: Aug. 24, 2011

(65) Prior Publication Data
US 2012/0053948 A1 Mar. 1, 2012

Related U.S. Application Data

(60) Provisional application No. 61/376,282, filed on Aug. 24, 2010.

(51) Int. Cl.
*H03M 7/30* (2006.01)

(52) U.S. Cl.
USPC .............. 341/87; 382/164; 382/166; 382/232; 704/500; 704/231; 704/234; 704/236; 704/251; 704/255; 704/240

(58) Field of Classification Search
USPC ......... 704/231, 234, 236–240, 251–255, 500; 341/50–87; 382/164, 166, 232
See application file for complete search history.

(56) References Cited

U.S. PATENT DOCUMENTS

| 5,452,092 | A | * | 9/1995 | Kang et al. | 358/426.02 |
|---|---|---|---|---|---|
| 7,158,669 | B2 | * | 1/2007 | Tanaka et al. | 382/166 |
| 7,783,459 | B2 | | 8/2010 | Rozell et al. | 702/189 |
| 8,499,898 | B2 | * | 8/2013 | Thorne | 188/20 |
| 8,553,994 | B2 | * | 10/2013 | Tian et al. | 382/232 |

FOREIGN PATENT DOCUMENTS

WO 2004/086302 10/2004 ............... G06T 9/00

OTHER PUBLICATIONS

EP appln No. 11178414 Search Report issued Nov. 19, 2012.
R. Pichevar, H. Najaf-Zadeh, and L. Thibault, "A biologically-inspired low-bit-rate universal audio coder," in Audio Eng. Society Conv., Austria, 2007.

(Continued)

*Primary Examiner* — Lam T Mai
(74) *Attorney, Agent, or Firm* — Teitelbaum & MacLean; Neil Teitelbaum; Doug MacLean

(57) ABSTRACT

The invention relates to compressing of sparse data sets contains sequences of data values and position information therefor. The position information may be in the form of position indices defining active positions of the data values in a sparse vector of length N. The position information is encoded into the data values by adjusting one or more of the data values within a pre-defined tolerance range, so that a pre-defined mapping function of the data values and their positions is close to a target value. In one embodiment, the mapping function is defined using a sub-set of N filler values which elements are used to fill empty positions in the input sparse data vector. At the decoder, the correct data positions are identified by searching though possible sub-sets of filler values.

20 Claims, 12 Drawing Sheets

(56) References Cited

OTHER PUBLICATIONS

R. Pichevar and H. Najaf-Zadeh, "Pattern extraction in sparse representations with application to audio coding," in European Signal Processing Conf., Glasgow, UK, 2009.

L. Perrinet, M. Samuelides, and S. Thorpe, "Coding static natural images using spiking event times: do neurons cooperate?" IEEE Transactions on Neural Networks, vol. 15(5), pp. 1164-1175, 2004.

K. Herrity, A. Gilbert, and J. Tropp, "Sparse approximation via iterative thresholding." in IEEE International Conference on Acoustics, Speech, and Signal Processing, Toulouse, France, 2006.

X R. G. Baraniuk, "Compressive Sensing," Lecture Notes in IEEE Signal Processing Magazine, vol. 24, No. 4, pp. 118-120, Jul. 2007.

H. Najaf-Zadeh and P. Kabal, "Improving Perceptual Coding of Narrowband Audio Signals at Low Rates", in Proc. ICASSP 1999, Phoenix, Arizona, Mar. 1999, pp. 913-916.

F. Mustiere, H. Najaf-Zadeh, R. Pichevar, H. Landili, L. Thibault, M. Bouchard, "Sparse Audio Coding Via Targeted Dithering and Combinatorial Decoding", 18$^{th}$ European Signal Processing Conference (EUSIPCO-2010), Aalborg, Denmark, Aug. 23-27, 2010, p. 249-253.

R. Pichevar, H. Najaf-Zadeh, and F. Mustiere, Neural-Based Approach to Perceptual Sparse Coding of Audio Signals, IEEE Joint Conference on Neural Networks, 2010, Barcelona, Spain.

H. Najaf-Zadeh, R. Pichevar, H. Landili, and L. Thibault, "Perceptual matching pursuit for audio coding," in Audio Engineering Society Convention 124, May 2008.

\* cited by examiner

SPARSE DATA COMPRESSION

CROSS-REFERENCE TO RELATED APPLICATIONS

The present invention claims priority from U.S. Provisional Patent Application No. 61/376,282 filed Aug. 24, 2010, which is incorporated herein by reference.

TECHNICAL FIELD

The present invention generally relates to data coding and more particularly relates to systems, devices and methods for compressively coding sparse data.

BACKGROUND OF THE INVENTION

Sparsely populated data sets are utilized in numerous technical fields. For example, signals representing audio, images and video can be well-approximated by a small subset of elements from a dictionary. Neurophysiological data obtained from the brain cortex has shown that the human brain in effect performs sparse coding of stimuli in a parallel manner using a large number of interconnected neurons. In this context, a sparse code refers to a representation where a relatively small number of neurons are active with the majority of neurons being inactive or showing low activity in a population. In more general contexts, a sparse code can be viewed as the representation of a signal by a small subset of elements, taken from a typically large dictionary of elements. The dictionary itself describes a domain in which the signal is interpreted, such as the frequency domain. It has been discovered that many physical signals can be represented by sparse codes, once interpreted in a suitable domain. Provided the domain is well-chosen, the representation of signals by sparse codes can greatly simplify and/or make more efficient many tasks of signal processing and transmission. As a result, sparse coding has been used in recent years as a strong tool for the processing of image, video, and sound, see for example U.S. Pat. No. 7,783,459, which is incorporated herein by reference, and the following articles: R. Pichevar, H. Najaf-Zadeh, and L. Thibault, "A biologically-inspired low-bit-rate universal audio coder," in Audio Eng. Society Conv., Austria, 2007; R. Pichevar and H. Najaf-Zadeh, "Pattern extraction in sparse representations with application to audio coding," in European Signal Processing Conf., Glasgow, UK, 2009; L. Perrinet, M. Samuelides, and S. Thorpe, "Coding static natural images using spiking event times: do neurons cooperate?" IEEE Transactions on Neural Networks, vol. 15(5), pp. 1164-1175, 2004; K. Herrity, A. Gilbert, and J. Tropp, "Sparse approximation via iterative thresholding." in IEEE International Conference on Acoustics, Speech, and Signal Processing, Toulouse, France, 2006. For example, image data that has been transformed by successive applications of wavelet transforms tends to have large portions occupied by zero and near-zero values, especially if the data is subjected to a data quantization step prior to encoding. As another example, the '459 patent teaches a neural network that implements a Local Competitive Algorithm (LCA) to sparsely code images using Gabor kernels as dictionary elements. A U.S. patent application Ser. No. 13/188,915 filed Jul. 22, 2011, which is assigned to the assignee of the present application and is incorporated herein by reference, discloses a Perceptual LCA (PLCA) for perceptual sparse coding of time-dependent audio signals using Gammatone or Gammachirp dictionary elements.

A sparse data set can be represented as a data array or a vector wherein a large proportion of data are zeros, with non-zero values sparsely distributed across the data set. As an illustration, audio coding is based on a sequence of steps that is conveniently described using mathematical notations as follows. Given a vector n representing a digitized audio signal, the first step is to represent n in a suitable transform domain, denoted by a transformation function $\psi(.)$, as follows:

$$x = \psi(n) \quad (1)$$

where a resulting length-L vector x often contains only $M \ll L$ significant, i.e. non-zero, elements, where the level of significance is determined by either perceptual or mathematical criteria. Generally, x can be multidimensional, but is assumed to be vectorized in the context of this specification. The property that x only contains $M \ll L$ non-negligible elements is referred to as sparseness of the vector x, and is at the foundation of transform coding. Generally, in the context of the present application we will be referring to a dataset or a vector representing it as sparse if M is less than L.

In a typical application, the process of encoding and storing the signal n typically includes the following steps: a) transforming n into x, b) perceptually or otherwise thresholding the vector x to retain only M non-zero values, yielding a sparse vector $\hat{x}$, iii) quantizing the M non-zero values of $\hat{x}$, and then iv) encoding them as well as their position in the vector/data set.

At a receiver, or at playback in the context of audio, the procedure amounts to decoding the quantized values and positions, placing them into a vector of length L and then applying the inverse to $\psi(.)$ transformation to recover an approximation $\hat{n}$ of n.

One drawback that is inherent to handling and transmitting sparse vectors, regardless of how they were obtained, is a potentially large overhead required to encode the positions of the active elements in $\hat{x}$, see. for example, R. G. Baraniuk, "Compressive Sensing," Lecture Notes in IEEE Signal Processing Magazine, Vol. 24, No. 4, pp. 118-120, July 2007, which is incorporated herein by reference. A straightforward approach to encoding the M positions from a position set of length L would require a binary vector of length $\log_2$ $$\binom{L}{M} \leq L.$$

Thus, it is an object of the present invention to address this deficiency by providing a compressive coder for sparse data sets that eliminates the need to transmit or store at least some of the sparse data positions, thereby reducing the overhead.

SUMMARY OF THE INVENTION

The present invention provides a method and apparatus for compressing sparse data sets representing audio, image, video or other signals by encoding sparse data positions into data values of the sparse data set.

One aspect of the present invention provides a method for electronically compressing sparse data, the method comprising: a) obtaining a sparse data set comprising a sequence of data values and position information therefor, wherein the position information individually associates the data values from the sequence with a subset of active positions from an ordered set of N possible positions, wherein $N > K \geq 1$, and wherein K is a number of the data values in the sequence; b) adjusting one or more of the data values using a pre-defined value modification process so as to obtain compressed sparse data wherein the position information is encoded in the data values; and, c) store or transmit the compressed sparse data for use by a decoder. In one aspect of the method, a set of N different filler values individually associated with the N possible positions is further provided, and step (b) comprises: b1) using a pre-defined mapping rule f to generate a mapped value F based on the data values and a filler sub-set v of the set of N filler values, wherein the filler sub-set v is obtained from the set of N filler values by excluding the filler values associated with the sub-set of active positions; and, b2) adjusting one or more of the data values so that the mapped value generated in step b1) is within a threshold distance $\epsilon$ from a target value T.

One aspect of the method includes providing at the decoder the set of N different filler values individually associated with the N possible positions; and, using the decoder for: d) extracting the data values from the compressed sparse data; e) applying the pre-defined mapping to the received data values and different selections of (N−K) filler values from the set of N filler values and comparing resulting mapped values to the target value T; f) determining positions associated with K filler values which, when excluded from the mapping in step (e), result in a mapped value that is within the threshold distance $\epsilon$ from the target value T; and, g) individually assigning the positions of the K filler values determined in step (f) to the received data values in accordance with an order thereof in the received compressed sparse data.

One aspect of the present invention provides a digital processing system for electronically compressing sparse data, comprising: input circuitry for obtaining a sparse data set comprising a sequence of data values and position information therefor, wherein the position information individually associates the data values from the sequence with a subset of active positions from an ordered set of N possible positions, wherein N>K≥1, wherein K is a total number of the data values in the sequence; a position encoder coupled to the input circuitry for receiving the sparse data set therefrom and for adjusting one or more of the data values using a pre-defined value modification process so as to obtain compressed sparse data wherein the position information is encoded in the data values; and, circuitry for storing the compressed sparse data or transmitting the compressed sparse data to a user.

In one aspect of the present invention, the position encoder comprises: filler memory for storing a full ordered set of N filler values individually associated with the N possible positions; a mapping unit coupled to the filler memory for generating a mapped value F based on the K data values and a filler set of (N−K) filler values using a pre-defined mapping rule, wherein the filler set is obtained by selecting from the filler memory all filler values stored therein excluding the filler values corresponding to the K active positions; and, a data modifier unit coupled to the mapping unit for iteratively adjusting one or more data values until the mapped value is within a pre-defined distance $\epsilon$ from a target value.

One aspect of the present invention provides a digital processing system for de-compressing the compressed sparse data received from the digital processing system of claim 11, which comprises: input circuitry for receiving the compressed sparse data and for extracting the sequence of data values therefrom; and, a position decoder for recovering the position information from the sequence of data values based on known information about the pre-defined value modification process, so as to restore the sparse data set. In one aspect of the present invention, the position decoder comprises: a mapping unit for applying the pre-defined mapping to the received data values and different combinations of (N−K) filler values from the ordered set of N filler values for computing mapped values, a comparator for comparing the mapped values to the target value T, and a position memory unit for storing positions associated with K filler values which, when excluded from the pre-defined mapping, result in a mapped value that is within the pre-defined distance $\epsilon$ from the target value T; and, an output circuitry for outputting a restored sparse data set formed of the received data values and the positions stored in the memory unit.

BRIEF DESCRIPTION OF THE DRAWINGS

The invention will be described in greater detail with reference to the accompanying drawings which represent preferred embodiments thereof, in which like elements are indicated with like reference numerals, and wherein:

FIG. 4 is a flowchart of a process of data value adjustment in the method of FIG. 3a;

DETAILED DESCRIPTION

Figure 1:
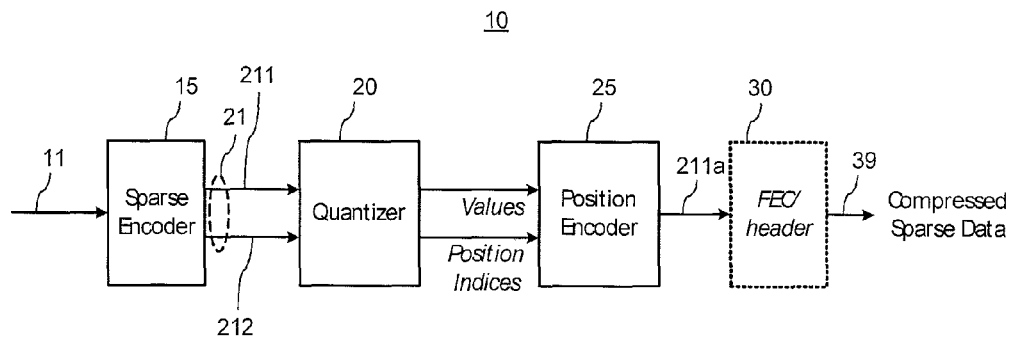
FIG. 1 is a general block diagram of a sparse signal coder including a position encoder.

In the following description of the exemplary embodiments of the present invention, reference is made to the accompanying drawings which form a part hereof, and which show by way of illustration specific embodiments in which the invention may be practiced. It is understood that other embodiments may be utilized and structural changes may be made without departing from the scope of the present invention. Reference herein to any embodiment means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Unless specifically stated otherwise and/or as is apparent from the following discussions, terms such as "processing," "operating," "computing," "calculating," "determining," or the like, refer to the action and processes of a computer, data processing system, logic circuit or similar processing device that manipulates and transforms data represented as physical, for example electronic, quantities. The terms 'output' and 'input' encompass analog and digital electromagnetic signals that may represent data sequences and single values. The terms 'data' and 'signal' are used herein interchangeably. The terms 'coupled' and 'connected' are used interchangeably; these terms and their derivatives encompass direct connections and indirect connections using intervening elements, unless clearly stated otherwise.

The following general notations are used in this specification: the notation x(i) denotes an i-th element of a sequence of elements or a vector x, with the integer 'i' representing a time sample or the element location in the sequence of elements represented by the vector x. The terms 'position' and 'location' are used interchangeably to mean a position of an element such as data value in an ordered sequence of elements. The notation $\{x(i)\}_K$ represents a set of all elements of a vector x of length K, and also an ordered sequence of the elements x(i), i=1, . . . , K, where K is the length of the sequence. In the context of this specification the vector notation will be used to represent ordered sequences of symbols, so that an i-th symbol x(i) in a sequence $\{x(i)\}_K$, i=1, . . . , K, will also be referred to as the $i^{th}$ element of a vector x representing said sequence, so that x=$\{x(i)\}_K$. The subscript "K" in the sequence notation $\{x(i)\}_K$ will be omitted where possible without loss of clarity. The notation [x] represents an integer part of x. The notations $$\binom{N}{K}$$

and $_NC_K$ are used interchangeably to represent a binominal coefficient that is equal to the number of distinct subsets of K elements from a set that has N elements, $$\binom{N}{K} = {}_NC_K = \frac{N!}{K!(N-K)!}.$$

In addition, the following is a partial list of abbreviated terms and their definitions used in the specification:
ASIC Application Specific Integrated Circuit
FEC Forward Error Correction
DSP Digital Signal Processor
FPGA Field Programmable Gate Array In the following description, reference is made to the accompanying drawings which form a part thereof and which illustrate several embodiments of the present invention. It is understood that other embodiments may be utilized and structural and operational changes may be made without departing from the scope of the present invention. The drawings include flowcharts and block diagrams. The functions of the various elements shown in the drawings may be provided through the use of dedicated data processing hardware such as but not limited to dedicated logical circuits within a data processing device, as well as data processing hardware capable of executing software in association with appropriate software. When provided by a processor, the functions may be provided by a single dedicated processor, by a single shared processor, or by a plurality of individual processors, some of which may be shared. The term "processor" should not be construed to refer exclusively to hardware capable of executing software, and may implicitly include without limitation, logical hardware circuits dedicated for performing specified functions, digital signal processor ("DSP") hardware, application specific integrated circuits (ASICs), field-programmable gate arrays (FPGAs), read-only memory ("ROM") for storing software, random access memory ("RAM"), and non-volatile storage. The term 'processor' when used with reference to hardware, may encompass digital and analog hardware or a combination thereof. It may also refer to a functional unit or module implemented in software or firmware using a shared hardware processor.

Furthermore, aspects of operation of the exemplary embodiments of the present invention are generally described herein using mathematical symbols and operations as common in the art. It is however understood that the mathematical symbols and operations are used herein to assist in understanding of the invention, and that they represent real physical, such as electrical, signals that are being transformed by hardware operating on these signals to produce useful and tangible results and to obtain specific technical advantages.

Figure 2:
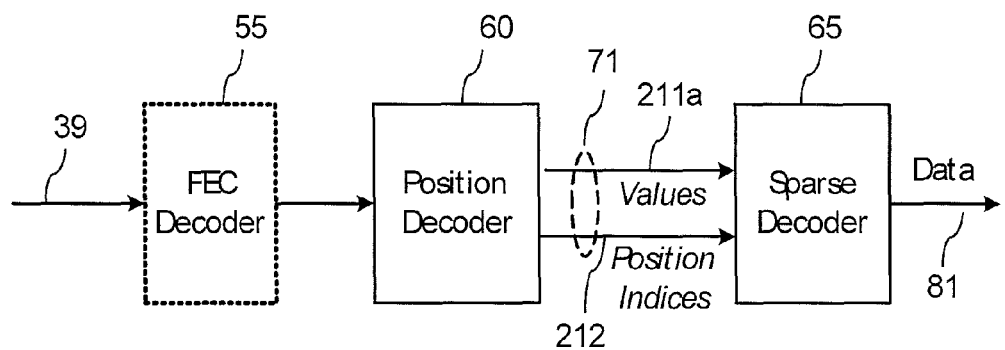
FIG. 2 is a general block diagram of a sparse signal decoder including a position decoder.

Referring first to FIGS. 1 and 2, there is illustrated one exemplary system in which elements of the present invention can be utilized. This exemplary system includes a digital processing system 10 for signal encoding, which is schematically illustrated in FIG. 1 and is also referred to herein as the signal encoder 10, and a digital processing system 50 for signal decoding, which is schematically illustrated in FIG. 2 and is also referred to herein as the signal decoder 50.

With reference to FIG. 1, the signal encoder 10 includes a sparse encoder 15, which is operatively followed a quantizer 20, a position encoder (PE) 25, and a FEC encoder/framer 30. One or both of the quantizer 20 and FEC encoder/framer 30 may be omitted in some embodiments. In operation, the sparse encoder 15 receives a signal w 11, for example in the form of a sequence of signal samples, pixel values, or as an analog signal, and encodes it to produce a sparse representation thereof in the form of a sparse data set 21. The sparse data set 21 is formed by a sequence of data values s(k) 211 and position information therefor 212, for example in the form of position indices p(k). The position information 212 individually associates the data values s(k) from the sequence 211 with the position indices p(k) forming a subset $\{p(k)\}_K$ of an ordered set of N possible positions. Here, K denotes the number of data values 211 in the sparse data set 21, wherein 1≤K<N. By way of example, the position indices may indicate particular dictionary elements from a plurality of N dictionary elements, such as used in sparse audio and image coding, or particular elements of a sensor array.

The sparse data set 21 is then optionally passed through a quantizer 20, which quantizes the data values 211 according to a pre-defined quantization scheme, as known in the art. The role of the quantizer 20 is to reduce the number of bits required to represent the data values 211. The quantization scheme is defined by a sequence of quantization levels q(i), and may be uniform or non-uniform. The spacing of the quantization levels q(i) may also differ in dependence upon the position p(k) of a respective data value s(k).

The quantizer 20 passes a quantized version of the sparse data set 21 to the position encoder 25, which encodes it so as to compress the input sparse dataset 21 by reducing an overhead associated with the position information 212. Operation principles of the position encoder 25 according to exemplary embodiment of the present invention are described hereinbelow. The PE 25 outputs an adjusted data sequence 211a wherein the position information is encoded into the data values s(k). The FEC encoder/framer 30 is optionally used to add a suitable header to the adjusted data sequence 211a as described hereinbelow, and/or to add error correction coding, or generally any suitable coding according to an application, and to output resulting compressed sparse data 39, which does not explicitly include the position information 212, for transmitting or storing thereof.

With reference to FIG. 2, the signal decoder 50 includes an optional FEC decoder 55, which is followed by a position decoder 60 that is in turn followed by a sparse decoder 70. The FEC decoder 55 receives the compressed sparse data 39, detects and corrects errors therein that appeared in the processed of the data transmission and/or storage, and passes the corrected compressed data to the position decoder 60. The position decoder 60 operates generally in reverse to the position encoder 25 as described hereinbelow; its function is to produce a decompressed sparse data set 71 that reproduces the original sparse data set 21, and in particular to restore the position information 212 for the data values of the adjusted data sequence 211a. The decompressed sparse data set 71 is then passed to the sparse decoder 65, which operates in reverse to the sparse encoder 15 to produce a received signal 81 that reproduces the original input signal 11.

For example, the sparse data set 21 may be a sparse representation of the signal w 11 in terms of a plurality of dictionary elements $\phi_n$, n=1, ..., N. More particularly, in this example the sparse data set 21 is defined by a set of all non-zero coefficients s(n) in a linear combination of the dictionary elements $\phi_n$ that approximates the signal w:

$$\tilde{w} = \sum_{n=1}^{N} s(n)\varphi_n. \quad (2)$$

In equation (2), $\tilde{w}$ is a decoded signal 81 suitably approximating the original signal w 11, while the sparse representation of the signal w, i.e. the sparse data set 21, is the plurality of all non-zero coefficients s( ) in the right hand side thereof, and their respective positions n=(p(k)), k=1, ..., K. Various methods to generate such sparse representations are known in the art and are not described here.

Turning now back to FIG. 1 and the position encoder 25, the sparse data set 21 at its input can be conveniently represented as a sparse vector $S_N = \{s(n)\}_N$ of length N, n=1, ..., N, with (N−K) zero elements and with the K non-zero data values s(k), k=1, ..., K. In the sparse vector $S_N$, these data values are located at the positions n=p(k), k=1, ..., K, that are defined by the subset $\{p(k)\}_K$, so that s(p(k))=s(k). Positions corresponding to non-zero elements in a sparse data vector, or generally in a sparse data set, are referred to herein as active positions. The subset $\{p(k)\}_K$, which is formed of all of the active positions in the sparse vector $S_N$, is referred to herein as the subset of active positions or the active position subset, and is conveniently represented by a position vector p=$\{p(k)\}_K$, which is also referred to herein as the support vector. The sequence of K non-zero data values $\{s(k)\}_K$ that are ordered according to their position in the sparse vector $S_N$ will be denoted by vector s of length K.

The operation of the position encoder 25 exploits a finite tolerance of the data values s(k) with respect to small variations. In a typical application utilizing sparse data coding, the end user can tolerate small distortions in the received data; in such application, the data values s(k) in the sparse data set 21 can be adjusted within pre-defined tolerance limits, without substantial negative effects for the user. We found that this finite tolerance of the data values to small adjustments can be utilized to encode the position information 212 into the data values 211 themselves, thus substantially eliminating the need to transmit the position information 212 additionally to the data values 211, and reduce the size of the overhead associated with the position information for the sparse data values. One example of such signals wherein small signal distortions are tolerated are digital media signals. In the context of the present specification, the term "media signal" means a signal carrying one or more of audio data, image data, and video data. The description hereinbelow will concentrate mainly on embodiments wherein the signal w 11 is a digital media signal, and the tolerance of the data values s(k) may be perceptually defined using known approaches and data on human perception of audio and images.

Figure 3A:
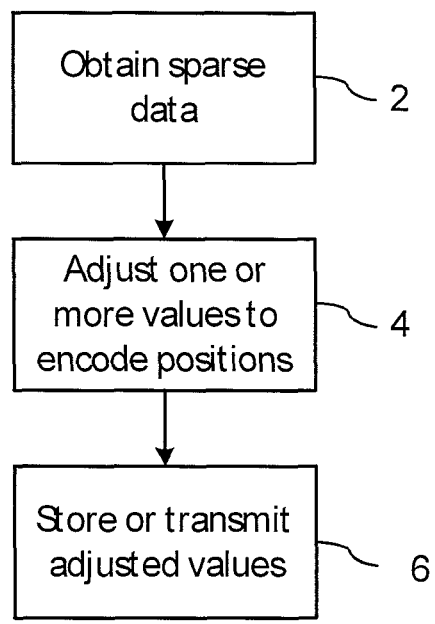
FIG. 3a is a flowchart of main steps of position encoding for sparse data sets.

With reference to FIG. 3a, steps of a method for sparse data compression implemented by the signal encoder 10 according to an embodiment of the present invention may be described as follows:

a) in step 2, obtaining the sparse data set s 21; b) in step 4, adjusting one or more of the data values s(k) using a pre-defined value modification process so as to obtain the compressed sparse data 39, wherein the position information 212 is encoded in the data values s(k); and, c) in step 6, store or transmit the compressed sparse data 39 for use by the decoder 50, without separately storing or transmitting the position information 212.

Figure 3B:
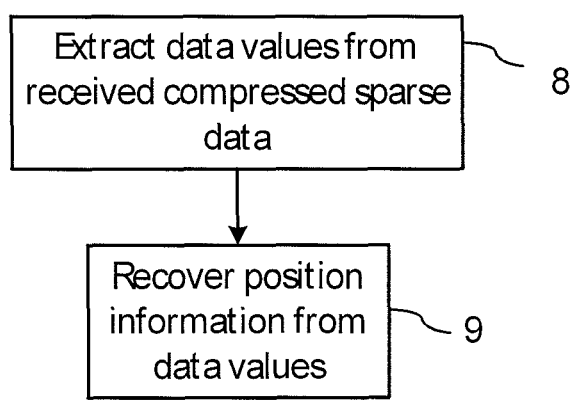
FIG. 3b is a flowchart of main steps of position decoding for sparse data sets compressed using the method of FIG. 3.

Referring now to FIG. 3b, the position decoder 60 may implement the following general steps in one embodiment of the invention: d) in step 8, extracting the data values s(k) from the compressed sparse data 39, and e) in step 9, recover the position information 212 from the data values s(k) 211a based on known information about the pre-defined data value modification process.

According to an aspect of the present invention, the data value modification process that is used at the position encoder 25 includes adjusting the data values s(k) in a way that brings a selected function f of the data values s(k) and their positions p(k) within a pre-defined distance ε from a target value T. The function f, which is also referred to herein as the targeting function or as a mapping rule, is known to the position decoder 65. The position decoder 65 can then simply search through different combinations of K positions from the N possible positions, i.e. search through possible support vectors p of length K, to find one combination of active positions that results in a value F of the function f that is within the threshold distance ε from the target T.

Figure 4:
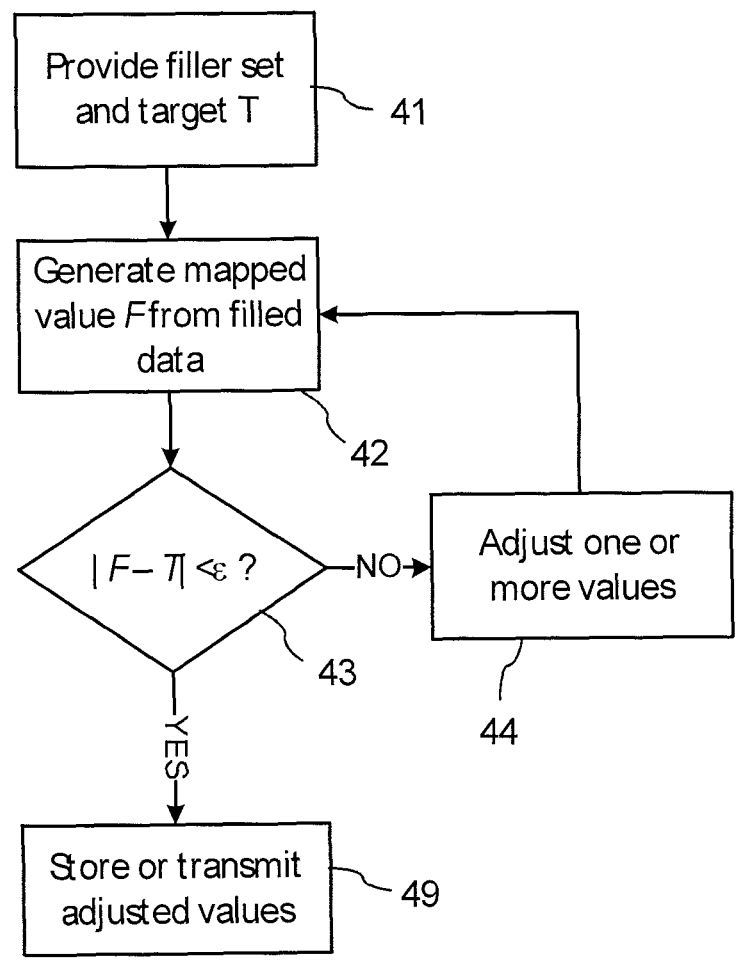

With reference to FIG. 4, in one embodiment of the present invention step 4 of position encoding may in turn include the following steps.

First, at step 41 an ordered set of N filler values v(n) individually associated with the N possible positions is provided. The full N-long set of these filler values may be represented by a vector $\bar{v}$ and referred to herein as the full filler set. In currently preferred embodiments each of these filler values is distinct, so that no two filler values are equal and differ from each other by more than that the threshold ε. Other considerations in selecting the set of filler values are provided hereinbelow.

In step 42, the pre-defined mapping rule is used to generate a mapped value F based on the data values s and a filler sub-set of the set of N filler values $\bar{v}$. The filler sub-set may be obtained from the set of N filler values by excluding the filler values for the sub-set of active positions p. Using vector notations, the filler subset is represented by a vector v, which is termed a filler vector and is obtained from $\bar{v}$ by replacing elements v(n) with zeros for all indices n contained in the active position vector p. The pre-defined mapping rule may be represented by a targeting function $f(s,v)$, which 'maps' the data values vector s and the filler subset v to a mapped value F, i.e.

$$f(s,v)=F. \tag{3}$$

Next, in step 43 the mapped value F is compared to the target T, and if the distance d=|F−T| between the mapped value and the target T exceeds $\epsilon$, in step 44 one or more of the data values s(k) are adjusted and steps 42, 43, and 44 (if required) repeated, until the mapped value generated in step 42 is within the pre-defined distance $\epsilon$ from the target value T, i.e. the following condition is satisfied:

$$|F-T|<\epsilon. \tag{4}$$

In one embodiment, the targeting function $f(s,v)$ is selected so that the mapped value F it generates is suitably close to the desired target value T, so that the distance d is relatively small, and the required adjustments of the data values are within the pre-defined tolerances. In one embodiment, the target value T is selected in dependence on F.

In one embodiment, the mapping defined by the targeting function $f$ corresponds simply to summing up the K data values and the filler values from the filler sub-set excluding the filler values for the active positions p of the data values, so that $$f(s,v)=\Sigma_n[s(n)+v(n)], \tag{5}$$

where the summation is from n=1 to N. In another embodiment, absolute values of s(n) and v(n) may be summed:

$$f(s,v)=\Sigma_n[|s(n)|+|v(n)|], \tag{6}$$

In one embodiment, the target value T is an integer that is suitably close to the mapped value F. For example, the target value T may be a value of an integer that is closest to the mapped value F for a given targeting function $f$, i.e.

$$f(s,v)=T+e, \tag{7}$$

wherein |e|<1. Parameter e can be viewed as an initial error of the targeting function $f$, which absolute value defines the initial distance between the mapped value F and the target value T before any adjustment of the data values s(k).

In the following we describe exemplary embodiments that use the mapping function of equation (5). It will be appreciated that other embodiments of the present invention can use other mapping rules.

In one embodiment wherein the data values s(k) are quantized, step 4 in FIG. 3 includes finding a minimal subset of data values from the K data values s(k) which, when adjusted by one or more quantization levels, reduces the target distance |F−T| between the mapped value F=$f(s,v)$ and the target value T to below a pre-defined threshold value $\epsilon$. Any suitable minimization algorithm that is known in the art can be used to perform this task according to the present invention. We found however that if the data adjustments at each iteration are limited to the adjacent quantization levels, this task can be accomplished very efficiently using a binary linear optimization algorithm to determine a set of binary coefficients u(l), l=1, . . . , 2K, each said binary coefficient defining whether one of the data values s(k) is to be adjusted up or down by one quantization interval, or generally by a specified amount. The process may be described using the following notations. Let integer i denote the $i^{th}$ quantization level of a data value s(k), and $q_k(i)$ its corresponding real value, so that s(k) can be equal to $q_k(i)$, $q_k(i\pm 1)$, $q_k(i\pm 2)$, etc. Next, let $\hat{\delta}$ be a length K row vector which elements $\hat{\delta}(k)$ are upward quantization intervals for the data values s(k), k=1, . . . , K. Namely, for every k∈{1, . . . , K}, if s(p(k))=$q_k(i)$, then $\hat{\delta}(k)=q_k(i+1)-q_k(i)$, where p is the position vector associated with the data vector s. Similarly, $\check{\delta}$ is a length K row vector which elements $\check{\delta}(k)$ are downward quantization intervals for the data values s(k), i.e. $\check{\delta}(k)=q_k(i-1)-q_k(i)$. Next, we define a length 2K range vector y according to equation (8):

$$y=\{1,1,\ldots 1,T-f(s,v)+\epsilon,-T+f(s,v)+\epsilon\}^T, \tag{8}$$

wherein each element of y is equal to 1, except the last two elements, which define lower and upper boundaries for allowable deviations of the mapped value F=$f(s,v)$ from the target value T.

We further define a binary adjustment vector u of length 2K, which elements u(l) are binary numbers, i.e. either 1 or 0, which define whether a particular data value s(k) is to be adjusted by one quantization interval. In particular, u(l)=1 for 1≤l≤K means that a data value s(l) is to be adjusted up by one quantization interval $\hat{\delta}(l)$ to a next higher quantization level $q_k(i+1)$, while u(l)=1 for K<l≤2K means that a data value s(l−K) is to be adjusted down by one quantization interval $\check{\delta}(l)$ to a next lower quantization level $q_k(i-1)$; u(l)=0 means that the data value s(l) or s(l−K) is not adjusted. We further define weight ||u|| of a vector u as a sum of its elements. For a binary vector, the weight is equal to the number of 'ones' that the vector contains.

Next, we denote a K×K unity matrix as $I_k$, and define a matrix Φ as follows:

$$\Phi = \begin{bmatrix} I_K & I_K \\ \hat{\delta} & \check{\delta} \\ -\hat{\delta} & -\check{\delta} \end{bmatrix} \tag{9}$$

With these definitions, step (4) in one embodiment of the invention includes finding a binary adjustment vector as a minimum-weight binary vector u that satisfied the following condition (10):

$$\Phi u \le y, \tag{10}$$

i.e. finding a solution u=$u_0$ to the following linear binary problem $$\arg\{\min\|u\|\}\text{subject to } \Phi u \le y. \tag{11}$$

Once the binary adjustment vector u is found, the next step is to adjust one or more of the data values s(k) by one quantization interval up or down as defined by the binary elements u(l) of the found binary adjustment vector u.

Advantageously, the problem defined by equation (11) can be efficiently solved using known in the arts algorithms for solving linear binary problems, such as Implicit Enumeration, or the Balas Additive Algorithm, which is in essence a branch-and-bound method based on efficient heuristics, and is described, for example, in E. Balas, "An additive algorithm for solving Linear Programs with zero-one variables," in Operatons Research, Vol. 13, No. 4, pp. 517-546, 1965.

Problem (11) has a trivial solution u=0 for $\epsilon$=e. Preferably, $\epsilon$ should be much smaller than the initial error e and, ideally, as low as possible to ensure that a correct set of K positions is found at the decoder. However, if a certain choice for $\epsilon$ makes finding the solution of problem (11) infeasible, a slightly larger value of $\epsilon$ can be attempted by the position encoder, until a solution $u_0$ to problem (11) is found.

We note also that by looking for a minimum-weight vector $u_0$ that satisfies the threshold condition (10), we require a solution with a minimum number of data values that need to be adjusted. Advantageously, this excludes solutions corresponding to needlessly exchanging two initially adjacent levels. This is, however, not a necessary requirement, and the present invention also encompasses embodiments which does not minimize the total number of data values s(k) that are adjusted in step 4 of the method of FIG. 3*a*. Furthermore, it may be preferred that no data value s(k), i.e. no element of the data vector s, is simultaneously increased and decreased, since that would not change the mapped value. Therefore, in a preferred embodiment the first and last K elements of u are additionally made to be mutually exclusive, so that u(k) and u(K+k) cannot be both 1 for any k=1, . . . , K, although this is not a necessary requirement within the scope of the present invention.

In some embodiments, the method may include verifying that adjusting one or more of the data values in step 4 of FIG. 3*a*, or in step 44 of FIG. 4, changes the respective data values by no more than a pre-determined tolerance value, or that the adjusted data values remain within a pre-defined tolerance interval. This tolerance value or tolerance interval may be same for all data values, or may vary between the data values, for example in dependence upon the position index thereof p(k). In order to account for this possible position dependence, the tolerance value for the k-th data value will be denoted as $\Delta(p(k))$. In the case of digital media signals such as audio, the tolerance may be perceptually defined, for example based on the absolute threshold of hearing, as described for example in R. Pichevar, H. Najaf-Zadeh, and F. Mustiere, Neural-Based Approach to Perceptual Sparse Coding of Audio Signals, IEEE Joint Conference on Neural Networks, 2010, Barcelona, Spain; H. Najaf-Zadeh, R. Pichevar, H. Landili, and L. Thibault, "Perceptual matching pursuit for audio coding," in Audio Engineering Society Convention 124, 5 2008, and U.S. patent application Ser. No. 13/188,915 filed Jul. 22, 2011, all of which are incorporated herein by reference. For example, step 4 may include verifying that quantization intervals $\hat{\delta}(k)$ and $\check{\delta}(k)$ are smaller than the tolerance value $\Delta(p(k))$. If either of these conditions is not satisfied, the respective adjustment of the data value s(k) is excluded from the data adjustment procedure, which may be accomplished, for example, by excluding a respective element from vector u and respectively decreasing its length. For each data value excluded from the adjustment procedure, the length of vector u is reduced by 2, with a respective reduction in the dimensionality of vectors $\hat{\delta}(k)$ and $\check{\delta}(k)$, and the unity matrix $I_K$ in equation (9).

If the tolerance $\Delta(p(k))$ for one or more data values is greater than two quantization intervals, the data adjustment procedure defined by a solution $u_0$ to the problem (11) can be repeated, each time excluding the elements whose amplitude have been modified to a maximum extent possible within the tolerances, and re-computing the mapped value $f(s,v)$ at the beginning of each new iteration.

Figure 5:
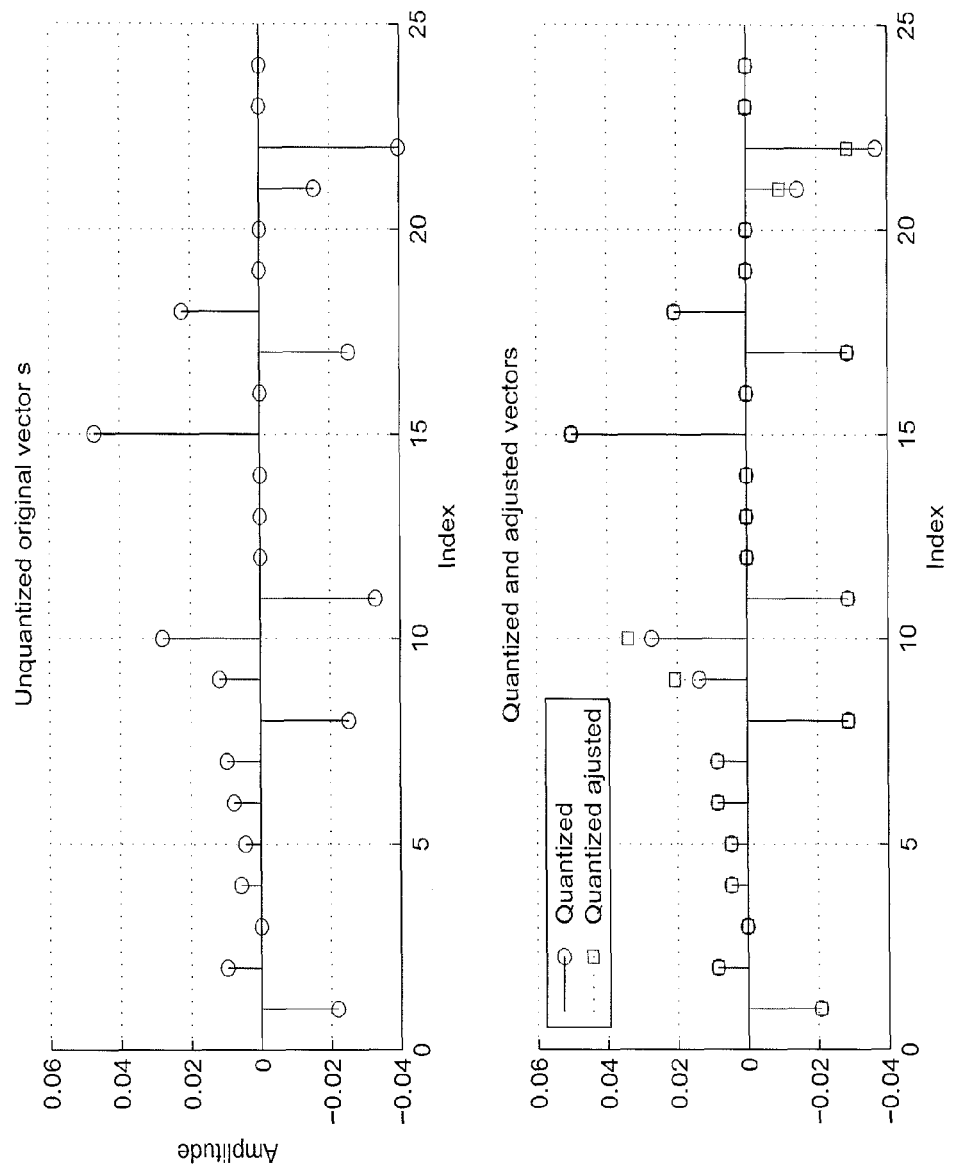
FIG. 5 is a graph illustrating an exemplary sparse data set before (circles) and after (squares) encoding the data positions into the data values in accordance with the method of FIG. 4.

By way of example, FIG. 5 shows results of implementing the aforedescribed data adjustment procedure to an exemplary sparse data set 21 with N=24 and K=15. The quantized data values before the adjustment step is shown by open circles in both upper panel (a) and lower panel (b), while values of the sparse data set 21 after the adjustment procedure are shown by open squares in the lower panel (b). In the exemplary case illustrated herein, 8-bit scalar quantization is used, and only one round of optimization defined by the solution to problem (11) was applied with $\epsilon=5\times10^{-5}$ and T=2.

The full filler set $\bar{v}$ used in this implementation is a pseudo-randomly generated vector with elements normally distributed around 0 with a standard deviation 10 time that of the data values s(k) in the data vector s, and the mapped value $f(s,v)$ for the unadjusted data vector is $\cong 2.28987$. For the adjusted data s, this value is about 1.99997; the adjustment procedure has changed four of the 15 non-zero data values.

Once one or more of the data values s(k) are adjusted so as to bring the mapped value F suitably close to the target value T, the resulting sequence of K data values that includes the one or more adjusted data values, which is referred to herein as the adjusted data sequence 211*a*, is passed for storing or transmitting to a user as the compressed sparse data. This adjusted data sequence may be used by the position decoder 60 to infer the set of position indices p(k) therefrom, provided that the decoder has an access to the full set of N filler values used by the encoding process, or a copy thereof, and has the knowledge of the mapping rule $f$ used by the encoder.

Indeed, since the filler vector v depends upon the sub-set of active positions $p=\{p(k)\}_K$ received with the original sparse data set 21, i.e. v=v(p), the mapped value F defined by the targeting function $f(s,v)$ also indirectly depends on the active positions p(k), i.e. the support vector p, and changes when the support vector changes. In the following, we will use the notation $F(s,p)=f(s,v(p))$ for the targeting function (mapping rule) to emphasize its dependence upon the support vector p. This property may be used to decode the correct active positions from the adjusted data values, as described hereinbelow in further detail. The decoding is simplified if condition (4) uniquely defines the support vector p, i.e. if the subset of active positions 212 is the only combination of K positions from the N possible positions which, when used to define a particular filler vector v, yields the mapped value $F=f(s,v)$ satisfying condition (4). The decoder can then simply search through all possible support vectors $p_j$, $j=1, {}_NC_K$, to find one support vector yielding a mapped value $F=F(s,p_j)$ satisfying condition (4), where $p_j$ is a length-K vector which elements are K distinct position indices ranging from 1 to N.

In order for the aforedescribed encoding method to work, the N filler values have to satisfy certain criteria. First, there should be a significant overlap between the distributions of the data values s(k) 211 and the filler values v(n). Second, in embodiments wherein the target value is selected to be an integer, at least some of the data values s(k) 211 used by the mapping function $f$ should be suitably close to a non-zero integer. Accordingly, in one embodiment the method includes suitably normalizing the data values s(k) prior to the encoding using a suitable normalization factor. We note that similar data pre-normalization is known in the art and used in many prior art codecs. The normalization factor may be known to both encoder and decoder, or may be transmitted to the decoder in the header of the compressed sparse data set 39. Next, the selection of the N filler values may be simplified if the encoder has information about parameters of the distribution of the data values s(k), such as their variance $\sigma$. For many physical signals and their sparse representations, such information can be easily obtained using known in the art methods. For example, audio samples represented in the Discrete Fourier Transform domain may be conveniently modeled as having a zero-mean Gaussian distribution; same may be assumed for many other types of signals. An approximation for the variance of the data values in the corresponding sparse representation may be easily obtained from the received sparse data as known in the art, or may be pre-computed.

In one embodiment, the N filler values are selected so that for a particular K, the sums of any two distinct sets of (N−K) filler values differ from each other by more than the threshold value ε. This set may be pre-selected and stored in a same order at both the encoder and the decoder, to be used in the position encoding and decoding by the targeted mapping and adjustment procedure as described herein.

In this embodiment, the position indices may be decoded from the adjusted data sequence 211a simply by searching for a set of (N−K) filler values which, when used together with the K data values received with 211a, result in a mapped value F satisfying condition 4. Main steps of the position decoding in this embodiment may be as illustrated in FIG. 6.

Figure 6:
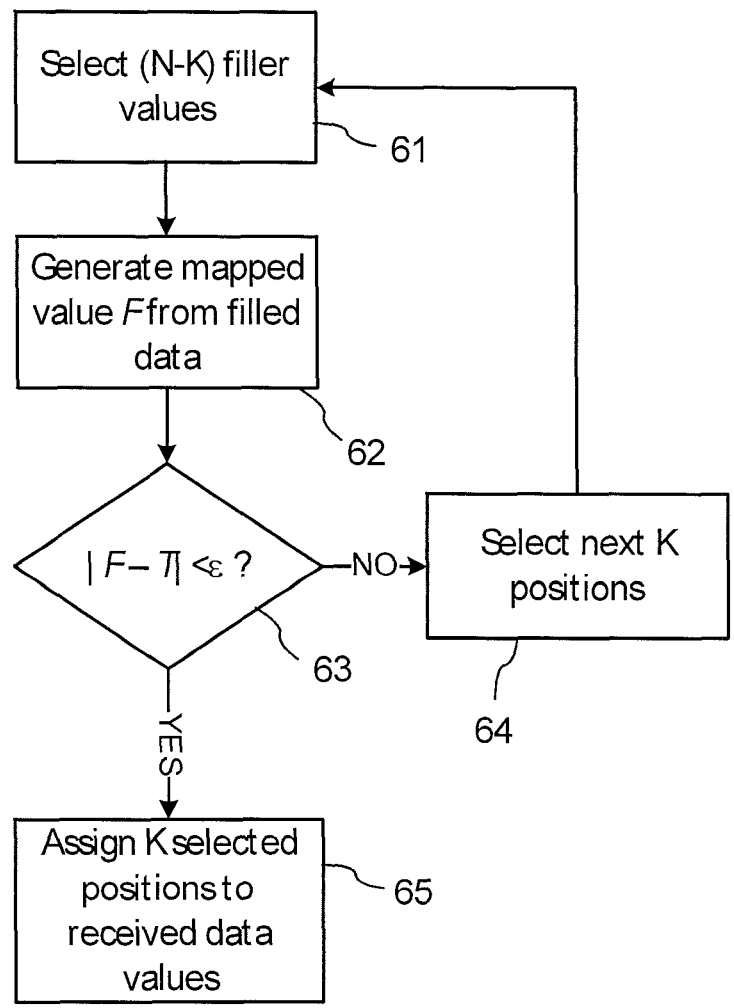
FIG. 6 is a flowchart of a process of position decoding based on adjusted data sequence.

Referring to FIG. 6, once the adjusted data sequence 211a is received and the number K of the data values in this sequence is determined, for example from the header of the compressed sparse data 39, the decoding starts at step 61 wherein (N−K) different filler values are selected from the ordered set of N filler values that was used in the encoding. This step may include selecting a subset of K positions from N possible positions of the filler values, that is selecting a particular support vector $p_j$, and then selecting a corresponding filler vector $v_j$, which contains all of the filler values from $\bar{v}$ excluding the filler values defined by the selected support vector $p_j$, i.e. corresponding to the selected subset of K positions. In step 62, the selected (N−K) filler values $v_j$, and K data values s(k) from the adjusted data sequence 211a are used to compute the mapped value $F=F(s,p_j)$ using the same mapping rule that was used by the encoder to generate the adjusted data sequence 211a. In step 63, the mapped value is compared to a target value T; if the distance therebetween is greater than the threshold ε, a next set of K positions to exclude from the filler set, i.e. a next support vector $p_j$ is selected in step 64, and the process returns to step 61 for selecting another set of (N−K) filler values based on the selected subset of K positions. The sequence of steps 61-62-63-64 is repeated until a set of K positions is found that yields the mapped value F satisfying condition (4) in step 64. In step 65, these K positions are assigned to the received data values s(k), for example in accordance with their order in the adjusted data set 211a.

Figure 7:
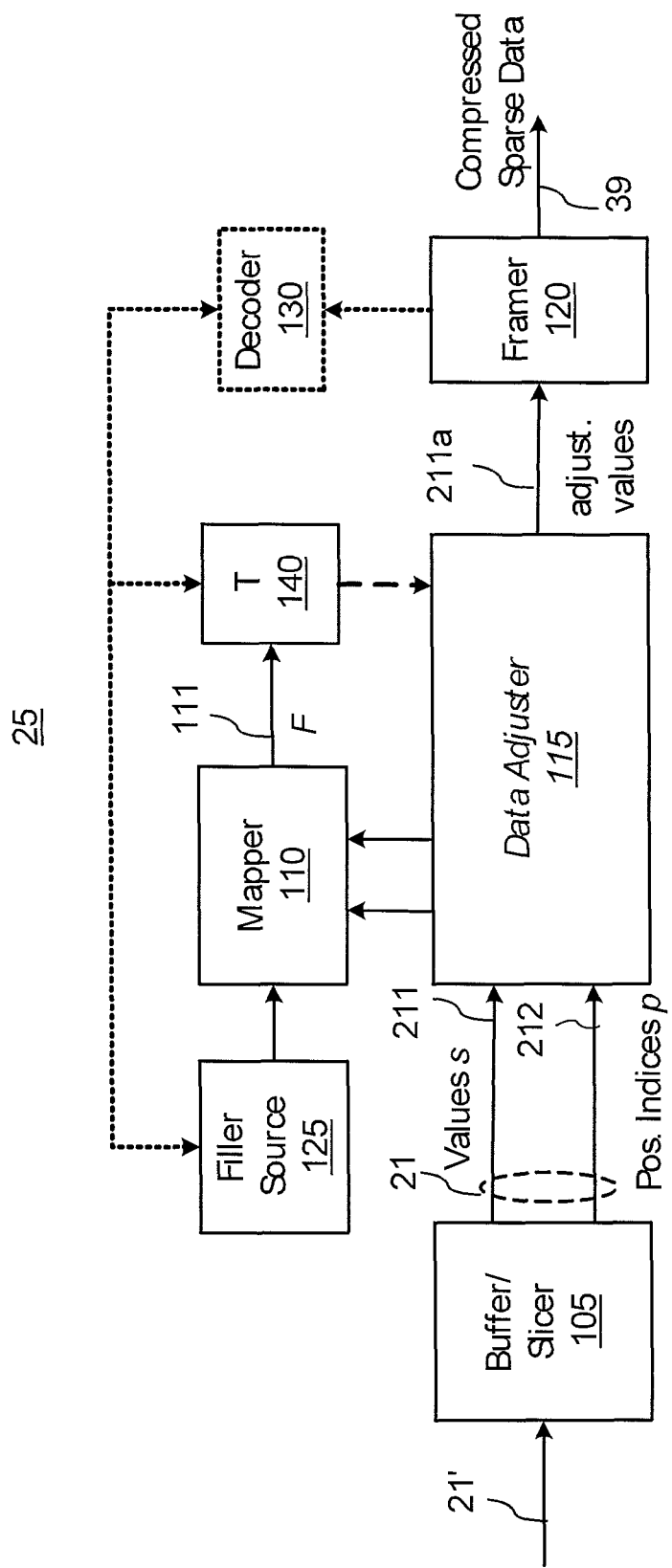
FIG. 7 is a schematic block diagram of one embodiment of a position encoder.

With reference to FIG. 7, there is illustrated a functional block diagram of an embodiment of the position encoder 25 that is suitable for implementing the position encoding method described hereinabove. In the shown embodiment, the position encoder 25 is a digital processing system that includes input circuitry 105 for obtaining sparse data, a data adjuster (DA) 115, which is also referred to herein as the data modifier 115, and output circuitry for storing and/or transmitting the compressed sparse data 39, which may include a framer 120 including an output buffer memory. The position encoder 25 further includes a dataset mapper 110, a filler source 125, and a target memory/comparator 140. In one embodiment, the position encoder 25 includes a co-located decoder 130. In the shown embodiment, the input circuitry 105 is in the form of a buffer memory, which may also perform input data slicing as described hereinbelow with reference to FIG. 8.

The functional elements shown as blocks in FIG. 7, including the mapper 110, the DA 115, the target memory/comparator 140, the decoder 130 and the framer 120 may be implemented as software modules that are executed by a hardware processor such as a microprocessor, a DSP, a general purpose processor, or as hardware logic, e.g., an ASIC, an FPGA, etc.

Figure 8A:
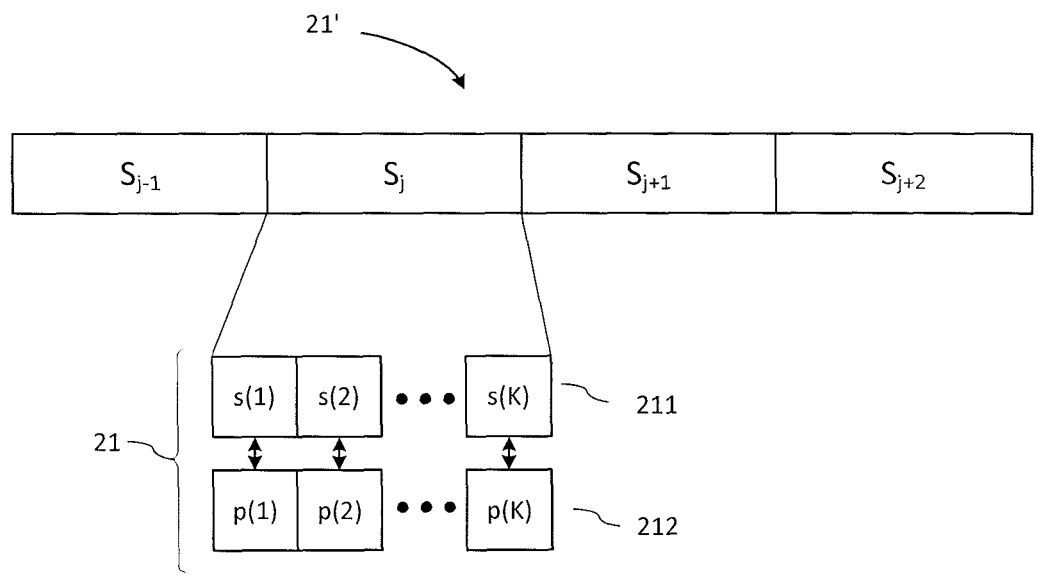
FIG. 8a is a schematic diagram illustrating subframe decomposition of long sparse vectors for forming sparse data sets of a desired length.

In operation, the input buffer/slicer 105 receives input sparse data 21', accumulates it, and passes the sparse data in the form of sparse data sets 21 to the data adjuster 115. With reference to FIG. 8a, in one embodiment the buffer/slicer 105 decomposes each frame of the input sparse data 21', which may be a sparse representation of one frame of the input signal 11, in a plurality of non-overlapping subframes $S_j$, each of which corresponding to N consecutive positions in a sparse vector x representing the input frame 21'. Here, N defines the length of each subframe, and is selected so that the maximum number of position combinations to be searched at the decoder, which is on the order of $_NC_K$, would not be too large for a particular application and available computation resources. Since a header may be required for each compressed subframe in at least some embodiments, reducing N may increase transmission overhead. Based on these considerations, an optimal subframe length N may be determined for each particular application. By way of example, we used N=24 when simulating the performance of the position coding for sparsely encoded audio signals using a general purpose computer. By way of example, FIG. 8a shows four such consecutive subframes that are labeled $S_{j-1}$, $S_j$, $S_{j+1}$ and $S_{j+2}$, with subframe $S_j$ carrying the sparse data set 21 formed of the sequence of K data values s(k) 211 and the sequence of K positions p(k) 212 individually associated therewith, as described hereinabove. The K data values s(k) and the K position indices p(k) may be individually stored in K data memory units and K position memory units, respectively, in the buffer 105; these memory units are schematically shown in FIG. 8 by squares labeled s(1) to s(K) and p(1) to p(K). The number of non-zero data values in other subframes, such as $S_{j-1}$, and $S_{j+1}$, may be different, so that the value of K is subframe dependent, i.e. may vary from one sparse data set 21 to another. Empty subframes that do not include any non-zero data values for N consecutive positions do not need to be encoded or transmitted, and may be referenced in the headers of non-empty subframes, as described hereinbelow by way of example.

Figure 8B:
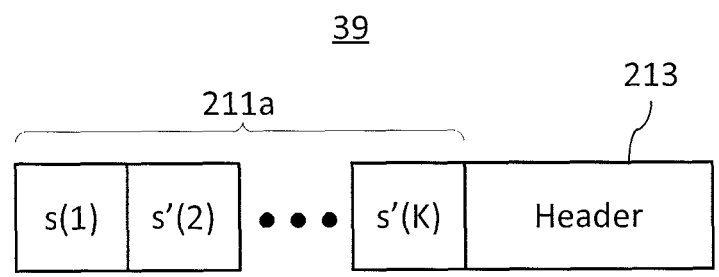
FIG. 8b is a schematic diagram of one frame of the compressed sparse data.

In one embodiment, the sparse data set 21 corresponding to each non-empty subframe $S_j$ is provided to the data adjuster 115 and the mapper 110 for further processing as described hereinabove with reference to FIG. 4. The sparse data set includes the K data values 211, and the support vector p 212 defining the positions thereof in the sparse data vector S. The mapper 110 is operatively coupled to the filler source 125, which generates and/or stores the ordered set of N filler values. Upon receiving the sparse data set 21, the mapper 110 obtains from the filler source 125 the filler vector v containing (N−K) filler values selected based on the support vector p as described hereinabove, and computes the mapped value 111 $F=f(s,v)$. The mapped value 111 is then provided to the target comparator 140, which computes the distance d between the target value T and the mapped value F, and compares it to the threshold ε. If condition (4) is not satisfied, the data adjuster 115 adjusts one or more of the data values s(k) and provides adjusted values to the mapper 110. The iterations continue until the target comparator 140 signals that condition (4) is satisfied, or a maximum number of iterations reached. When condition (4) is satisfied, the data adjuster 115 outputs the adjusted data sequence 211a, optionally passing it to the framer 120 for adding a header 213, as illustrated in FIG. 8b; note that in FIG. 8b notation s( ) is used for data values that are not adjusted, such as s(1) in the illustrated example, and s'( ) is used to denote adjusted data values. Information carried by the header 213 may vary depending on a particular embodiment, as described hereinbelow. In one embodiment, the header 213 includes the target value T. In one embodiment, the header may include the number of active positions K. In one embodiment, the header may include information indicating the threshold value ε used at the decoder, for example the exponent thereof, or the exponent of the final distance d at the encoder. In embodiments wherein the adjusted data sequence 211a corresponds to one subframe $S_j$, the header may include information indicating the presence or absence of empty subframe preceding or following the adjusted data sequence 39. By way of example, the header may include two bits a which values may be set as follows: "00" to indicate that there are no active elements in the current subframe; "01" to indicate that there are no active elements in the next 6 subframes; "1" to indicate that there is at least one active element in the current subframe. Of course, other header bits assignments are possible.

It may not always be possible to find a single set of N filler values that ensures successful decoding of the correct position information for any input data set 21 that may be expected in a particular application. Accordingly, in some embodiments the filler source 125 of the PE 25 may store or generate a plurality of ordered sets of N filler values $\bar{v}$. Furthermore in some embodiments the PE 25 additionally includes a co-located position decoder (PD) 130 that is coupled to the framer 120, or directly to the output of the DA 115, for receiving the adjusted data sequence 211*a*. Its function is to verify that the correct active position indices p(k) 212 can be decoded from the adjusted data sequence 211*a*.

Figure 9:
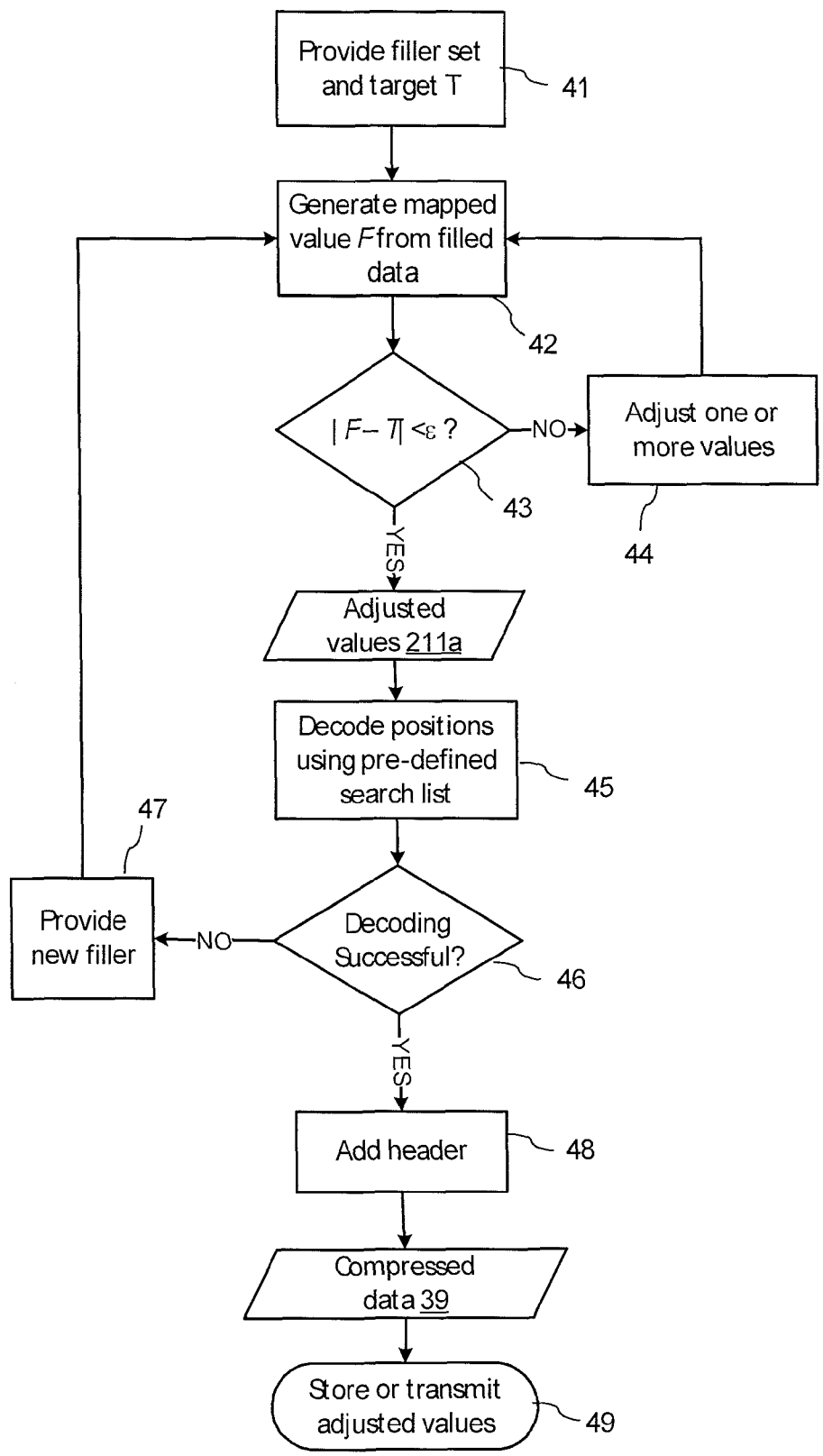
FIG. 9 is a flowchart of the process of position encoding by data value adjustment with decoding verification.

With reference to FIG. 9, in one such embodiment the process of position encoding may start with selecting in step 41 one of the full filler sets $\bar{v}$. The processing then continues to iterate between steps 42, 43 and 44 as described hereinabove with reference to FIG. 4 and further with reference to FIG. 7, until the mapped value F computed by the mapper 110 at step 42 satisfies condition (4) or another suitable threshold condition. Next, in step 45 the sequence of K adjusted data values 211*a* is passed to the co-located position decoder 130, which may operate, for example, as described hereinabove with reference to FIG. 6. If the decoding is successful, i.e. if the co-located decoder 130 is able to find the correct K positions p(k) 212, the adjusted data values 211*a* are passed to the framer 120, for arranging them in a pre-defined order known to the decoder 60 and for optionally adding the header 213. The resulting compressed subframe 39 is outputted for storing and/or transmitting in step 49.

Figure 10:
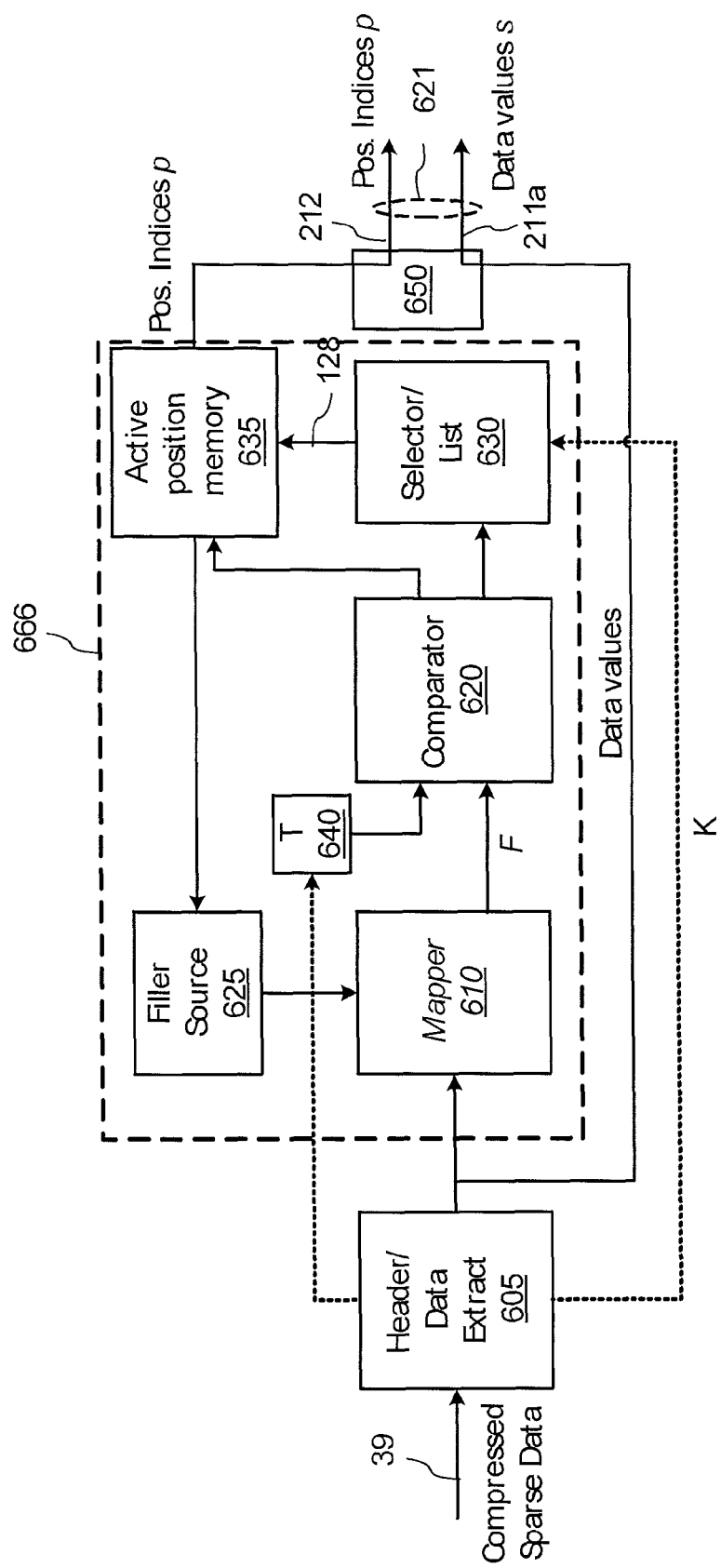
FIG. 10 is a schematic block diagram of one embodiment of a position decoder.

Turning now to FIG. 10, there is illustrated one embodiment of the position decoder (PD) 60 that can be used for decoding the compressed sparse data 39. The PD 60 is a digital processing system that includes at its input a data extractor (DE) 605, which is operationally followed by a mapper 610, which is in turn followed by a comparator 620 that is coupled to a selector/list memory (SLM) 630, an active position memory (APM) 635 and an optional target source 640. A filler source 625 that is coupled to the mapper 610 and the APM 635 is further provided.

The functional elements shown as blocks in FIG. 10, including the mapper 610, the comparator 620, the SLM 630, the filler source 625, and the output framer 650 may be implemented as software modules that are executed by a hardware processor such as a microprocessor, a DSP, a general purpose processor, or as hardware logic, e.g., an ASIC, an FPGA, etc, or by a plurality of hardware processors.

In operation, the DE 605 receives the compressed data 39 and extracts therefrom the adjusted data sequence 211*a*, i.e. the sequence of K data values s(k), one or more of which have been adjusted by the PE 25 as described hereinabove. Optionally, the DE 605 also extracts header information from the header 213 to aid in the decoding. In one embodiment, the header information includes the target value T, which is passed to the target source or memory 640 for saving therein. In one embodiment, the header 213 includes information, such as an integer parameter FL, uniquely identifying the set of N filler values that was used in the position encoding by the encoder 25 as described hereinabove. The FL value may be passed from the DE 606 to the filler source 625 for selecting a correct set of N filler values from a bank of full filler sets. In one embodiment, the filler source is in the form of, or includes, filler memory for storing filler sets $\bar{v}$ that are exact copies of the filler sets stored at the PE 25, and the FL value indicates a correct stored filler set to use for the particular compressed sparse data 39. In one embodiment, the filler source 625 is in the form of, or includes, a filler generator for generating the ordered sets of N filler values in dependence upon a seed value, and the FL defines the seed value for generating the correct filler set $\bar{v}$. In such embodiments, the filler $\bar{v}$ sets are uniquely defined by the seed values, and substantially identical filler generators are used at both the PD 60 and PE 25. In one embodiment, the filler generator includes, or is based upon, a random number generator.

Blocks 610, 620, 625, 630, 635 and 640 form a logical circuit that is referred to as a positions search module (PSM) 666. In operation, PSM 666 receives the adjusted data sequence 211*a* and, optionally, the header information, and operates generally to implement the iterative position decoding method described hereinabove with reference to FIG. 6. The function of the SLM 630 is to provide a sequence of different length—K support vectors $p_j$ 128, optionally following a pre-defined search list of the support vectors. Each of these support vectors $p_j$ defines a different set of K position indices as described hereinabove, with a current support vector optionally being stored in the APM 635. Based on the current support vector 128, the filler source 625 provides a filler vector $v_j$ containing (N−K) filler values, with the filler values defined by $p_j$ 128 excluded, to the mapper 610; index 'j' in notation $v_j$ is used to indicate that the filler vector depends on the support vector $p_j$ as described hereinabove with reference to FIG. 6. The mapper 610 operates generally as the mapper 110 described hereinabove with reference to FIG. 7, and is configured to implement the same mapping rule as the mapper 110 to compute a mapped value $F_j=F(s,p_j)\equiv f(s,v_j)$, where s denotes the adjusted data sequence 211*a* of length K. The comparator 620, which is functionally substantially identical to the comparator 140 of the PE 25 of FIG. 7, compares the mapped value to the target value; if the distance therebetween exceeds a threshold value $\epsilon$, the SLM 630 generates a next support vector $p_j$, incrementing the iteration index 'j' by one, with the new support vector replacing the support vector stored in the APM 635. The iterations continue until the comparator 620 indicates that the threshold condition (4) is satisfied, at which point the corresponding support vector $p_j$, currently stored in the APM 635 is sent to an output framer 650, for forming a decompressed sparse dataset 621 which approximately reproduces the input sparse dataset 21, and includes the sequence of adjusted data values 211*a* and K position indices $p_j(k)$ individually associated therewith, so that each of the data values s(k) is associated with a different one of the K position indices $p_j(k)$ defined by the support vector $p_j$.

In some embodiments, depending on the selected full filler sets $\bar{v}$ and the threshold $\epsilon$ used at the decoding, there may be more than one possible choice of the K-long support vector $p_j$ that satisfies the threshold condition (4). In this case, the aforedescribed decoding process may result in 'false positives'. In such embodiments, the process of position encoding and decoding described hereinabove can be modified to ensure that the correct support vector is selected first and before the false positives, or the false positives are discounted by the PD 60.

For example, in one embodiment the decoder 130 at the PE 25 and the SLM 630 generate the trial support vectors $p_j$ following a same search list, which may be, for example, saved in memory of both the PE 25 and the PD 60, or generated in real-time using identical list generators. The co-located decoder 130 of the PE 25 may then, following the pre-defined search list, may record the order of appearance of the correct support vector, and communicate a corresponding sequence number to the PD 60 in the header 213, which may include a few bits allocated therefor. For example, the header 213 may include an integer P indicating the number of false positives encountered by the decoder 130 at the PE 25, and the PSM 666 may sequentially test different selections of (N−K) filler values in the specified order until (P+1) mapped values are obtained that lie within the threshold distance $\epsilon$ from the target T.

In embodiments wherein the PD 60 may be configured so that it does not require header information for correct decoding of the position information, the header 213 may be omitted so that the compressed sparse data 39 consists substantially of the adjusted data sequence 211*a*, i.e. the sequence of K data values s(k), one or more of which have been adjusted by the DA 115, which are transmitted or stored in an specified order, for example in a sequence defined by their positions p(k).

In one embodiment, optimum values of the target T and the threshold $\epsilon$ may be pre-determined and stored in memory of each of the PE 25 and PD 60. The set of N filler values may then be selected so that the sum $V_K(p_j)$ of any K filler values is '$\epsilon$-distinct', i.e. differs from the sum $V_K(p_{j'})$ of any other selection of K of the filler values by more than $\epsilon$ for j≠j'. Since the number K of active elements in the sparse set may vary, this condition should hold for any possible K≤N/2, noting that if K>N/2, empty positions may be encoded instead.

In some embodiment, instead of comparing the mapped value to a pre-stored or received target T, PD 620 may determine the target value T based on the received data sequence 211*a*. By way of example, in some embodiments, the PE 25 uses an integer that is closest to the original mapped value $f(s,v)$, i.e. $\text{INT}\{f(s,v)\}$, as the target value T, i.e. $T=\text{INT}\{f(s,v)\}$. In one embodiment, this target value may be then sent to the PD 60 in the header 213. In one embodiment, instead of sending this target value T to the PD 60, the comparator 620 may compute the target value T at each iteration as an integer value that is closest to the current mapped value $F_j$, i.e. $T=\text{INT}\{F(s,p_j)\}$. This however, requires a specific filler set, which could be pre-computed using computer simulations.

The aforedescribed embodiments and their variants may be implemented in various computing environments and using various computing and/or data transmission configurations. It is also possible to transmit any transcoded version of the compressed data, provided a mirror transcoder is also present at reception. For example, the FEC encoder/framer may include an entropy encoder, such as traditional Huffman or Arithmetic encoders, to further process the compressed data before transmission. If this is the case, then the FEC decoder must contain the appropriate entropy decoder. The PE 25 and PE 60 may be implemented as software modules that are executed by one or more hardware processors, such as a microprocessor, a DSP, a general purpose processor, etc., or as hardware logic, e.g., an ASIC, an FPGA, etc., including a quantum computer. The position encoding and decoding for sparse data sets may be implemented as a method, apparatus or article of manufacture using standard programming and/or engineering techniques to produce software, firmware, hardware, or any combination thereof.

Figure 11:
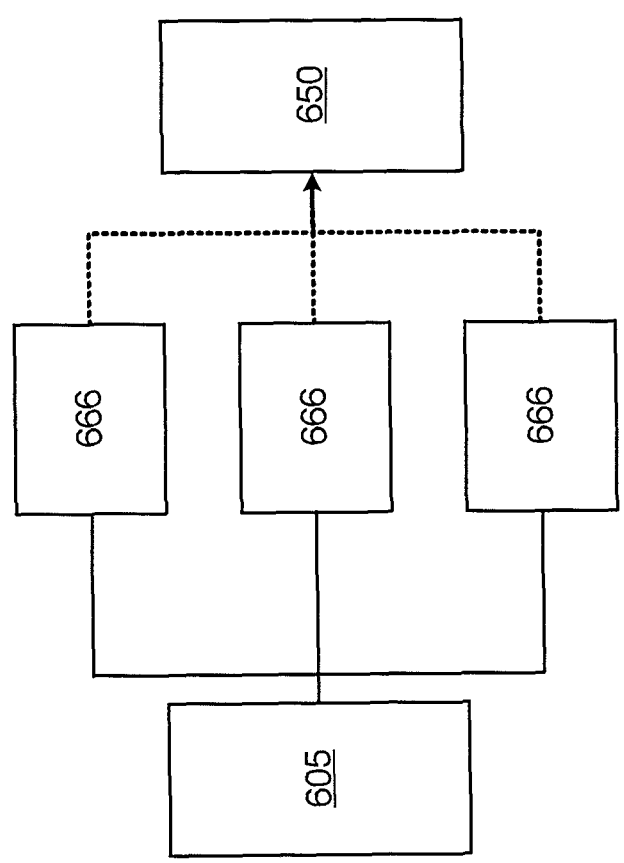
FIG. 11 is a schematic block diagram of the position decoder embodied using a plurality of parallel processors.

The search space of possible support vectors $p_j$ may be on the order of $_NC_K$ and may be fairly large, depending on values of N and K. Accordingly, in one embodiment that is schematically illustrated in FIG. 11, the PD 60 may include multiple instances of PSM 666 operating in parallel so as to search different sub-spaces of the total search space of possible support vectors, i.e. to search through different combinations of K possible positions and thus test different selections of (N−K) filler values. Once a correct support vector is found by one of the instances of the PSM 666, it is sent to the output framer 650, and further search by all of the PSMs 666 is stopped. Each of the PSM instances may be implemented on a different processor so that the PD 60 of FIG. 11 is implanted using a plurality of processors connected in parallel. The processors may be co-located, or may belong to different computers, which may communicate over a common network, for example using a cloud computing model.

Figure 12:
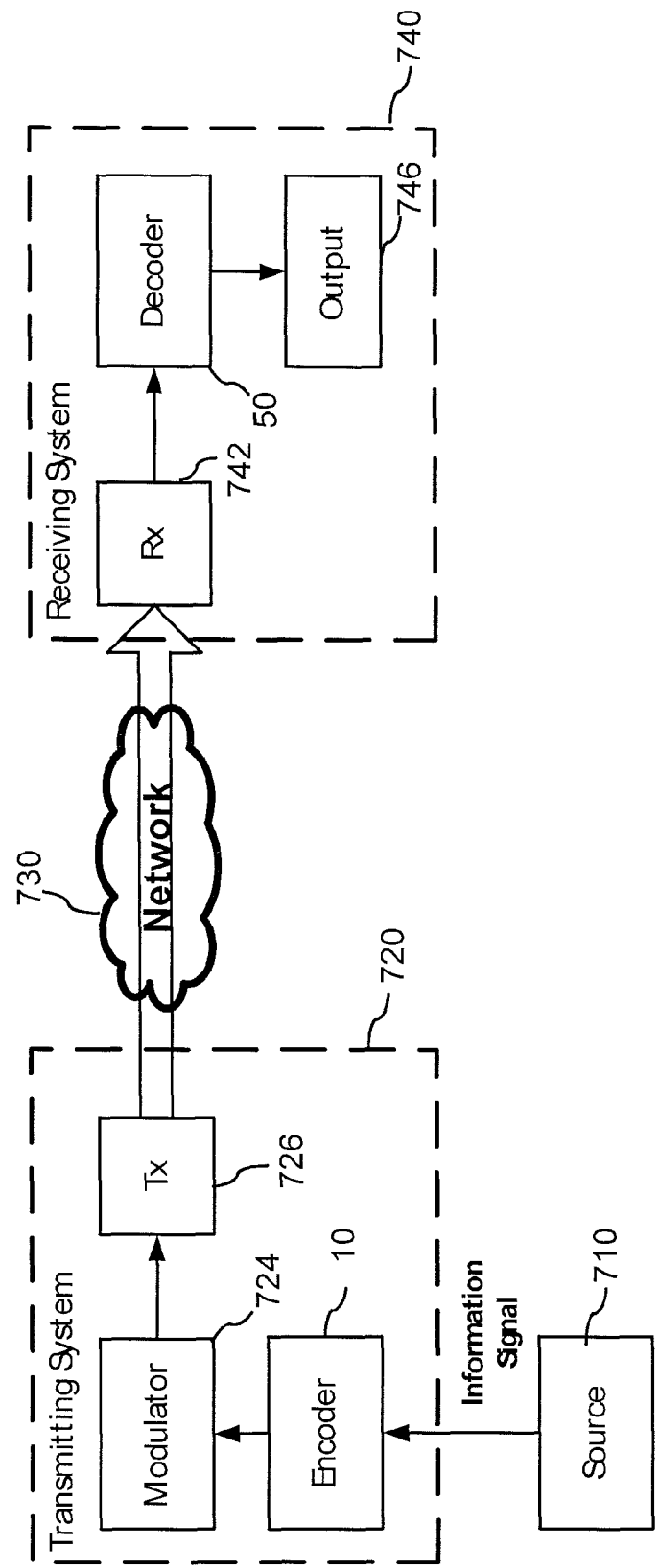
FIG. 12 is a schematic block diagram of a transmission system utilizing sparse data compression of the present invention.
Figure 13:
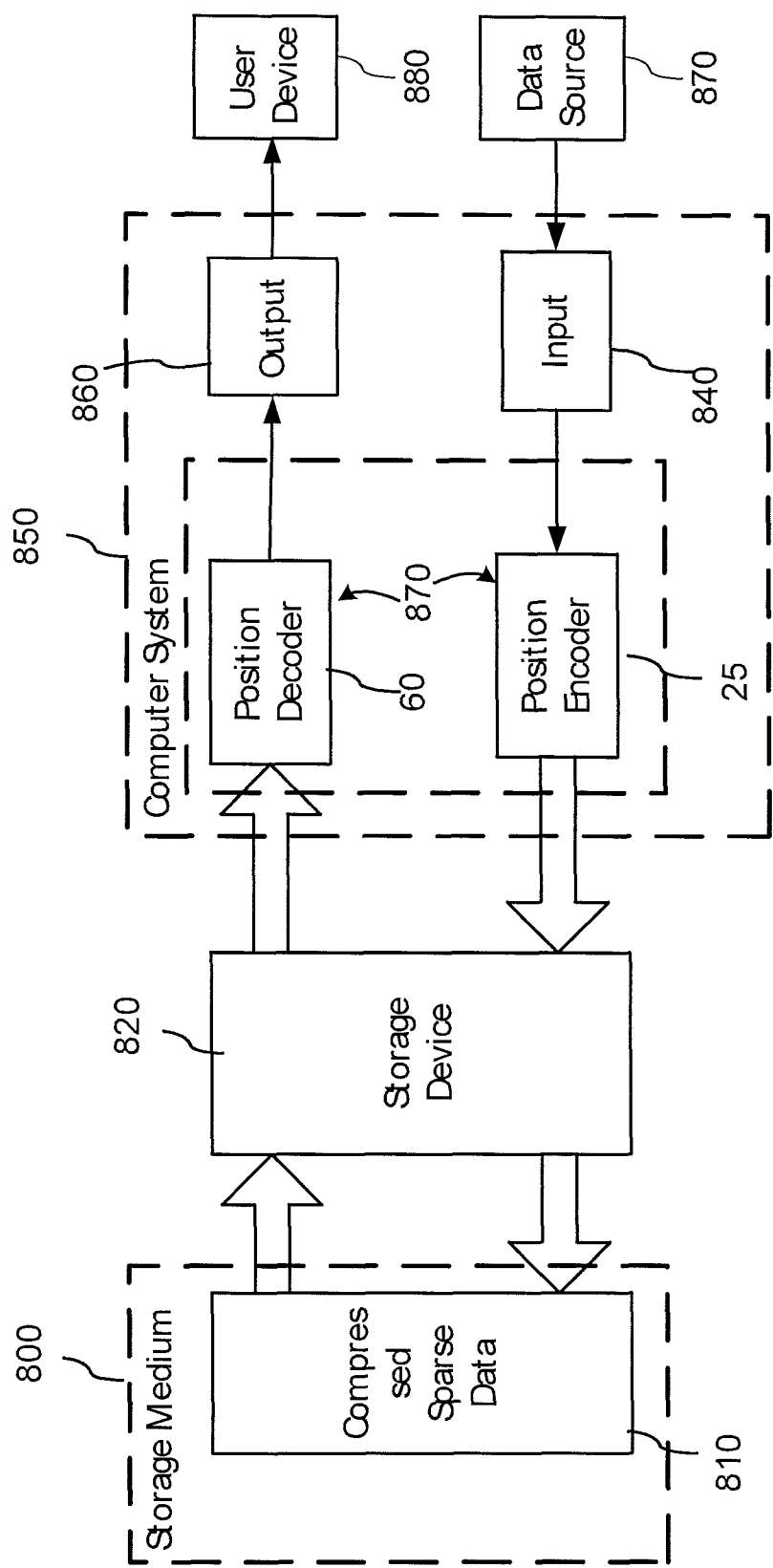
FIG. 13 is a schematic block diagram of a computer storage system utilizing sparse data compression of the present invention.

The sparse data compression by encoding active positions into data values of the present invention can be advantageously used in many application and computing environments where sparse data sets are encountered. The PE 25 and PE 60 may be included in an audio or video codec, for example as parts of the sparse data encoder and decoder shown in FIGS. 1 and 2, for coding digital media data. One possible application is in a wireless or wireline communication system that is generally illustrated in FIG. 12. A transmitting system 720 includes the signal encoder 10 as illustrated in FIG. 1, followed by a modulator 724, which may include one or more frequency up-conversion circuits as known in the art, and a transmitter 726. The transmitting system 720 generates an electrical, including in different embodiments electromagnetic or optical, communication signal S(t). This communication signal is received by a receiving system 740 after propagation through a wireless and/or wireline network 730. The receiving system 740 includes a receiver 742, the signal decoder 50 as illustrated in FIG. 2, and an output device or component 746 for rendering decoded data, such as a video and/or audio terminal, a memory device, etc. The transmitting system 720 may be embodied using any type of computer or electronic device that is capable of transmitting digital data over the communication channel 730. The communication channel 730 may include any type of data communication network, including a wireless network, e.g., telephone communication system, cellular communication system, digital radio, digital television, satellite, infrared, etc., or a wired network, e.g., the Internet, an Intranet, Local Area Network (LAN), storage area network (SAN)), or a combination of two or more thereof. Similarly, the receiving system 740 may be embodied using any type of computer or electronic device that is capable of receiving digital data over the communication channel 730.

The encoder 10 receives a digital electrical signal carrying a digital media signal from a media signal source 710, such as a digital audio recording device, a digital video or photo camera, or a memory device, obtains a sparse representation of the digital media signal, and compresses it by encoding active positions in the sparse representation into data values thereof to obtain compressed sparse data. The encoder 10 outputs an encoded electrical signal carrying the compressed sparse data in the form of compressed frames containing adjusted sequences of data values and headers; this encoded electrical data signal may then be used by the modulator 724 to modulate an electrical or optical carrier using a selected modulation format, with the resulting communication signal transmitted over the network 730 by the transmitter 726.

In the receiving system 740, the transmitted communication signal is received by the receiver 742, which incorporates a data receiving component including an analog to digital converter for sampling the received communication signal for converting the received communication signal into a sequence or set of received samples representing the compressed sparse data, and may also include a de-modulator, one or more frequency down-conversion circuits, and an amplifier. The decoder 50 then de-compresses the compressed sparse data to recover the active positions of the data values optionally using header information, for example as described hereinabove with reference to FIGS. 2, 6 and 10, and restores the digital media signal from the de-compressed sparse representation thereof, such as using dictionary signals in accordance with equation (2). The restored digital media signal is then provided for rendering to the output device or component 748, such as a video and/or audio terminal, a memory device, etc, and for presenting to the user.

FIG. 12 illustrates another implementation wherein techniques of sparse data compression by position encoding are used for data archiving. Storage capacity is of concern when archiving large amounts of data, such as large personal or institutional video archives, real-time video and audio recording, monitoring data from video monitors or distributed sensor networks collected over extended periods of time, etc. Sparse data encoding prior to archiving helps to decrease storage capacity requirements. In accordance with the present invention, the effective storage capacity of the storage medium 800 is further increased by the position encoding of the sparse data. The shown exemplary implementation includes a computer system 850 and a storage medium 800 having compressed sparse data 810 stored therein. The storage medium 800 may be, for example, a removable storage medium, such as an optical disk, swappable disk, solid state flash memory etc., a non-removable storage medium, for example one or more hard disk drives, solid state drives, etc. Accordingly, the sparse data 810 have been compressed by encoding active positions for each data set into data values thereof. A storage device 820, such as an optical disk drive, hard drive interface, USB flash drive interface, a network interface, etc, communicates electrical signals representing the compressed data sets 810 between the storage medium 800 and the computer 850. The computer 850 includes a hardware processor 870 implementing the position encoder 25 and the position decoder 60. The position encoder 25 receives sparse data sets from an input device 640, compresses them by encoding data positions into data values as described hereinabove with respect to FIGS. 3*a*, 6 and 7, and outputs compressed sparse data to the storage device 820 for storing in the storage medium 800. At user request, the computer 850 accesses data in the storage medium 800, including the sparse data sets 810, via the storage device 820. The compressed sparse data 810 read from the storage medium 820 is communicated to the position decoder 60, which de-compresses it by decoding the original data value positions as described hereinabove with reference to FIGS. 3*b*, 6, and 10, and provides restored sparse data to an output device 860 for passing to a user device 880. The PE 25 and the PD 60 together form a sparse data compressing codec (SDCC) 870.

The system of FIG. 12 may represent a personal computer wherein a user has installed a software implementation of the sparse data compressing codec 870, for the purpose of archiving audio and video files. The input and output devices 840, 860 may in this case includes suitable sparse encoders and decoders, with the data source 870 being, for example, a memory device or a remote network server, and the user device 880 representing a monitor, speakers, etc. The system of FIG. 12 may also represent a network attached storage (NAS) that is connected using the input/output devices 860/840, which may be embodied using a network card, to a user computer embodying 880 and 870 via a LAN, or a remote storage facility for remotely archiving user data via the Internet. The system of FIG. 12 may also represent a surveillance system wherein the data source 870 represents a monitoring device that generates large amount of surveillance data that are being continuously recorded and sent, for example wirelessly, to the computer 850 for archiving. The user device 880 may be a remote computer, such as for example a smartphone, that the user may use to retrieve archived data 810 as required.

Additional Implementation Details

One implementation of the invention provides an article of manufacture that comprises at least one of a hardware device having hardware logic and a computer readable storage medium including a computer program code embodied therein that is executable by a computer, said computer program code comprising instructions for performing operations for electronically compressing sparse data by encoding active positions of a sparse data set into data values thereof, said computer program code further comprising distinct software modules, the distinct software modules comprising a dataset mapper module and a data adjuster module. As described hereinabove, the operations may include: a) obtaining the sparse data set containing a sequence of data values and position information therefor; b) using the dataset mapper module for mapping the sparse dataset to a mapped value depending on the data values and the active data positions thereof; c) using the data adjuster module for adjusting one or more of the data values so as to bring the mapped value within a pre-defined distance from a target value, and d) outputting an adjusted sequence of the data values for storing in memory or transmitting to a user.

One implementation of the invention provides an article of manufacture that comprises at least one of a hardware device having hardware logic and a computer readable storage medium including a computer program code embodied therein that is executable by a computer, said computer program code comprising instructions for performing operations for decoding active positions in a sparse data set from a sequence of data values thereof, said computer program code further comprising distinct software modules, the distinct software modules comprising a dataset mapper module and a data adjuster module for adjusting one or more of the data values. As described hereinabove, the operations may include: a) sequentially selecting subsets of possible data positions for the data values from the sequence of data values; b) using the dataset mapper module for mapping the data values and each of the selected subsets of possible data positions to a mapped value; c) comparing the mapped values to a target value to determine which of the selected subsets of data positions is a correct subset of active positions for the sequence of data values, and d) outputting a sparse data set containing the sequence of data values and the subset of active positions for forming an output signal for providing to a user.

The term "article of manufacture" as used herein refers to code or logic implemented in hardware logic, for example an integrated circuit chip, FPGA, ASIC, etc., or a computer readable medium, such as but not limited to magnetic storage medium, for example hard disk drives, floppy disks, tape, etc., optical storage, for example CD-ROMs, optical disks, etc., volatile and non-volatile memory devices, for example EEPROMs, ROMs, PROMs, RAMs, DRAMs, SRAMs, firmware, programmable logic, etc. Code in the computer readable medium is accessed and executed by a processor. Of course, those skilled in the art will recognize that many modifications may be made to this configuration without departing from the scope of the present invention, and that the article of manufacture may comprise any information bearing tangible medium known in the art.

Although the invention has been described hereinabove with reference to specific exemplary embodiments, it is not limited thereto, but is defined by the spirit and scope of the appended claims. Various improvements and modifications of the aforedescribed embodiments will be apparent to those skilled in the art from the present specification. For example, although the invention has been described hereinabove with reference to coding of media signals, the invention may be equally applied to compressing of other types of sparsely defined data. For example, the invention may be applied for compressively coding and storing of alarm-type signals from sensor networks, including distributed systems of fiber-optic sensors and communication networks. Other embodiments and modifications of the embodiments described herein are also possible.

We claim:

1. A method for electronically compressing sparse data, the method comprising:
   a) obtaining a sparse data set comprising a sequence of data values and position information therefor, wherein the position information individually associates the data values from the sequence with a subset of active positions from an ordered set of N possible positions, wherein $N > K \geq 1$, and wherein K is a number of the data values in the sequence;
   b) adjusting one or more of the data values using a pre-defined value modification process so as to obtain compressed sparse data wherein the position information is encoded in the data values; and,
   c) store or transmit the compressed sparse data for use by a decoder.

2. The method of claim 1, further comprising:
   providing a set of N different filler values individually associated with the N possible positions;
   wherein step (b) comprises:
      b1) using a pre-defined mapping rule $f$ to generate a mapped value F based on the data values and a filler sub-set v of the set of N filler values, wherein the filler sub-set v is obtained from the set of N filler values by excluding the filler values associated with the sub-set of active positions; and,
      b2) adjusting one or more of the data values so that the mapped value generated in step b1) is within a threshold distance $\epsilon$ from a target value T.

3. The method of claim 2, wherein step b1) comprises computing a sum of the K data values and the (N−K) filler values from the filler sub-set.

4. The method of claim 2, wherein the target value T is an integer.

5. The method of claim 2, further comprising verifying that step (b2) changes the one or more data values by no more than a pre-determined tolerance value $\Delta$.

6. The method of claim 2, wherein the sequence of data values and position information therefor constitutes one sub-frame of the sparse data set, and wherein the method further comprises decomposing the sparse data set into a plurality of sub-frames including the one sub-frame.

7. The method of claim 3, wherein the data values are quantized, and wherein
   step (b2) comprises determining a minimal subset of the data values which, when adjusted by one or more quantization levels, reduces a distance $|F-T|$ between the mapped value F and the target value T to below the threshold distance.

8. The method of claim 7, wherein the step of finding the minimal subset of the data values comprises using a binary linear optimization algorithm to determine a set of binary coefficients, each said binary coefficient defining whether one of the data values is to be adjusted by one quantization level.

9. The method of claim 1, further comprising using the decoder for:
   extracting the data values from the compressed sparse data;
   recovering the position information from the data values based on known information about the pre-defined value modification process.

10. The method of claim 2, further comprising:
    providing at the decoder the set of N different filler values individually associated with the N possible positions; and,
    using the decoder for:
       d) extracting the data values from the compressed sparse data;
       e) applying the pre-defined mapping to the received data values and different selections of (N−K) filler values from the set of N filler values and comparing resulting mapped values to the target value T;
       f) determining positions associated with K filler values which, when excluded from the mapping in step (e), result in a mapped value that is within the threshold distance $\epsilon$ from the target value T; and,
       g) individually assigning the positions of the K filler values determined in step (f) to the received data values in accordance with an order thereof in the received compressed sparse data.

11. The method of claim 10, wherein the compressed sparse data comprises information indicating a number P of false positives, and wherein step (e) comprises sequentially testing different selections of (N−K) filler values in a specified order until (P+1) mapped values are obtained that lie within the threshold distance $\epsilon$ from the target T.

12. The method of claim 2, wherein the sparse data represents a digital media signal that is encoded using a sparse encoder followed by a quantizer, and wherein the data values represent gain coefficients for K dictionary elements from an ordered plurality of N dictionary elements, and wherein the active positions correspond to positions of the K dictionary elements in the ordered plurality of N dictionary elements.

13. The method of claim 12, wherein the digital media signal comprises audio signal, and wherein the data values represent gain coefficients in a sparse representation of the audio signal.

14. The method of claim 2, further comprising transmitting to the decoder information indicating the number K of the data values in the sequence of data values.

15. The method of claim 2, further comprising transmitting to the decoder information indicating at least one of: the target value T, and the threshold distance $\epsilon$.

16. A digital processing system for electronically compressing sparse data, comprising:
    input circuitry for obtaining a sparse data set comprising a sequence of data values and position information therefor, wherein the position information individually associates the data values from the sequence with a subset of active positions from an ordered set of N possible positions, wherein $N > K \geq 1$, wherein K is a total number of the data values in the sequence;
    a position encoder coupled to the input circuitry for receiving the sparse data set therefrom and for adjusting one or more of the data values using a pre-defined value modification process so as to obtain compressed sparse data wherein the position information is encoded in the data values; and, circuitry for storing the compressed sparse data or transmitting the compressed sparse data to a user.

17. A digital processing system of claim 16, wherein the position encoder comprises:

filler memory for storing a full ordered set of N filler values individually associated with the N possible positions;

a mapping unit coupled to the filler memory for generating a mapped value F based on the K data values and a filler set of (N−K) filler values using a pre-defined mapping rule, wherein the filler set is obtained by selecting from the filler memory all filler values stored therein excluding the filler values corresponding to the K active positions; and, a data modifier unit coupled to the mapping unit for adjusting one or more data values until the mapped value is within a pre-defined distance $\epsilon$ from a target value.

18. A digital processing system for de-compressing the compressed sparse data received from the digital processing system of claim 16, comprising:

input circuitry for receiving the compressed sparse data and for extracting the sequence of data values therefrom; and, a position decoder for recovering the position information from the sequence of data values based on known information about the pre-defined value modification process, so as to restore the sparse data set.

19. A digital processing system of claim 18, wherein the position decoder comprises:

a mapping unit for applying the pre-defined mapping to the received data values and different combinations of (N−K) filler values from the ordered set of N filler values for computing mapped values, a comparator for comparing the mapped values to the target value T, and a position memory unit for storing positions associated with K filler values which, when excluded from the pre-defined mapping, result in a mapped value that is within the pre-defined distance $\epsilon$ from the target value T; and, an output circuitry for outputting a restored sparse data set formed of the received data values and the positions stored in the memory unit.

20. The digital processing system of claim 19, wherein the position decoder comprises a plurality of parallel position decoding processors for testing different selections of (N−K) filler values.

* * * * *